(12) United States Patent
Keane et al.

(10) Patent No.: US 10,164,606 B1
(45) Date of Patent: Dec. 25, 2018

(54) LOAD-COMPENSATED TUNABLE COUPLING

(71) Applicants: Zachary Kyle Keane, Baltimore, MD (US); Joel D. Strand, Ellicott City, MD (US); Ofer Naaman, Ellicott City, MD (US)

(72) Inventors: Zachary Kyle Keane, Baltimore, MD (US); Joel D. Strand, Ellicott City, MD (US); Ofer Naaman, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/868,416

(22) Filed: Jan. 11, 2018

(51) Int. Cl.
*H03H 11/04* (2006.01)
*H03K 19/0175* (2006.01)
*H03K 19/195* (2006.01)
*H01L 39/22* (2006.01)

(52) U.S. Cl.
CPC .......... *H03H 11/04* (2013.01); *H01L 39/223* (2013.01); *H03K 19/017545* (2013.01); *H03K 19/195* (2013.01)

(58) Field of Classification Search
CPC ................ H03H 11/04; H03K 19/195; H03K 19/017545; Y10S 505/832; Y10S 505/864; Y10S 505/865; H01L 39/025; H01L 39/223
See application file for complete search history.

(56) References Cited

U.S. PATENT DOCUMENTS 9,929,978 B2 * 3/2018 Naaman ................. H03K 17/92
10,042,805 B2 * 8/2018 Naaman .............. G06F 13/4027
2017/0212860 A1 7/2017 Naaman et al.

* cited by examiner

*Primary Examiner* — Jung Kim
(74) *Attorney, Agent, or Firm* — Tarolli, Sundheim, Covell & Tummino LLP

(57) ABSTRACT

A load-compensated tunable coupler leverages a cross-bar switch and simulated loads or ballasts to provide a tunable coupling between two quantum objects that can be selectively coupled or decoupled without changing their resonant frequencies.

20 Claims, 5 Drawing Sheets

US 10,164,606 B1

LOAD-COMPENSATED TUNABLE COUPLING

GOVERNMENT INTEREST

The invention was made under Government Contract Number 30069353. Therefore, the US Government has rights to the invention as specified in that contract.

TECHNICAL FIELD

The present invention relates generally to superconducting circuits, and specifically to load-compensated tunable coupling of quantum objects.

BACKGROUND

Conventional microwave mechanical, electro-mechanical, and electronic switches may not compatible with on-chip integration with, and cryogenic operation of, superconducting electronic circuits, because of incompatible fabrication processes and high power dissipation. Likewise, tunable filters that are commonly realized by use of either active components such as voltage-variable capacitors (i.e., varactors), mechanical drivers, or ferroelectric and ferrite materials, are not easily controllable by signal levels that can be generated with single flux quantum (SFQ) technologies, and many are not operable at cryogenic temperatures. While superconducting microwave filters, both fixed and tunable, have been previously realized using both high temperature and low temperature superconductors, their use in switching applications suffers from high return loss, limited usable bandwidth, and poor out-of-band off-state isolation.

Semiconductor cross-bar switches, both for digital and microwave signals, are used in reconfigurable signal routing applications such as switch matrices, transceivers, and test and communications systems. The cross-bar switch is a 4-port device, where in a first setting (referred to as "bar state") a first input port is connected to a first output port and a second input port is connected to a second output port, and in a second setting (referred to as "cross state") the first input port is connected to the second output port and the second input port is connected to the first output port. However, conventional cross-bar switches are generally not compatible with cryogenic ultra-low-power consumption applications and in general require voltage control signals of order of a few volts which are incompatible with SFQ control technologies.

SUMMARY

The load-compensated tunable coupler described herein leverages a cross-bar switch and simulated loads, also referred to herein as ballasts, to provide a tunable coupling between two quantum objects without changing their resonant frequencies.

In one example, a superconducting load-compensated tunable coupler system is provided. The system includes a first quantum object connected to a first port of a superconducting cross-bar switch, a first dummy load approximating a load characteristic of the first quantum object connected to a second port of the switch, a second quantum object connected to a third port of the switch, and a second dummy load approximating a load characteristic of the second quantum object connected to a fourth port of the switch. The first and second quantum objects are coupled in a cross state of the switch. In a bar state of the switch, first and second quantum objects are uncoupled, the first quantum object is coupled to the second dummy load, and the second quantum object is coupled to the first dummy load.

Another example provides a method of coupling and load-compensated uncoupling two quantum objects. A first quantum object and a second quantum object are coupled. At the same time as uncoupling the two quantum objects, the first quantum object is coupled to a first simulated load designed to appear to the first quantum object as if it is the second quantum object, and the second quantum object is coupled to a second simulated load designed to appear to the second quantum object as if it is the first quantum object. For example, the first simulated load can be an inductor sized to present the same inductive load to the first quantum object as the first quantum object would experience from being coupled to the second quantum object, and the second simulated load can be an inductor sized to present the same inductive load to the second quantum object as the second quantum object would experience from being coupled to the first quantum object.

In yet another example, a superconducting load-compensated tunable coupler system can couple and decouple first and second quantum objects each having a respective operating frequency. A Josephson junction bridge is configured as a superconducting cross-bar switch. The bridge is made up of four Josephson junctions. A first Josephson junction is connected between the first quantum object and a first end of a second ballast that approximates an inductive load characteristic of the second quantum object. A second Josephson junction is connected between the first end of the second ballast and a first end of a first ballast that approximates an inductive load characteristic of the first quantum object. A third Josephson junction is connected between the first quantum object and the second quantum object. A fourth Josephson junction is connected between the second quantum object and the first end of the first ballast. One or more flux bias lines are arranged to switch the inductance of the Josephson junctions between, on the one hand, the first and fourth Josephson junctions having a high inductance state and the second and third Josephson junctions having a low inductance state, wherein the first and second quantum objects are coupled to each other, and, on the other hand, the first and fourth Josephson junctions having a low inductance state and the second and third Josephson junctions having a high inductance state, wherein the first quantum object is coupled to the second ballast and the second quantum object is coupled to the first ballast.

DETAILED DESCRIPTION

This disclosure relates generally to superconducting circuits, and more particularly to a load-compensated tunable coupler between two quantum objects. The superconducting load-compensated tunable coupler can include a superconducting cross-bar switch with a switch control system that includes a switch controller and bias elements. The superconducting cross-bar switch, also known as a cross-point or transfer switch, can employ variable inductance coupling elements controlled by magnetic flux via the bias elements and the switch controller to couple and decouple different sections of the switch to and from one another to switch between a bar state and a cross state. The superconducting cross-bar switch can operate at cryogenic temperatures, dissipate substantially no power, and can be controlled with single flux quantum (SFQ) compatible signals. The switch can connect each of two quantum objects either to each other or to ballasts that can simulate the load of a target quantum object. Accordingly, the load-compensated tunable coupler overcomes the limitations associated with using a tunable inductive element between objects, which can present a variable load on both objects and undesirably change their operating frequencies.

Figure 1A:
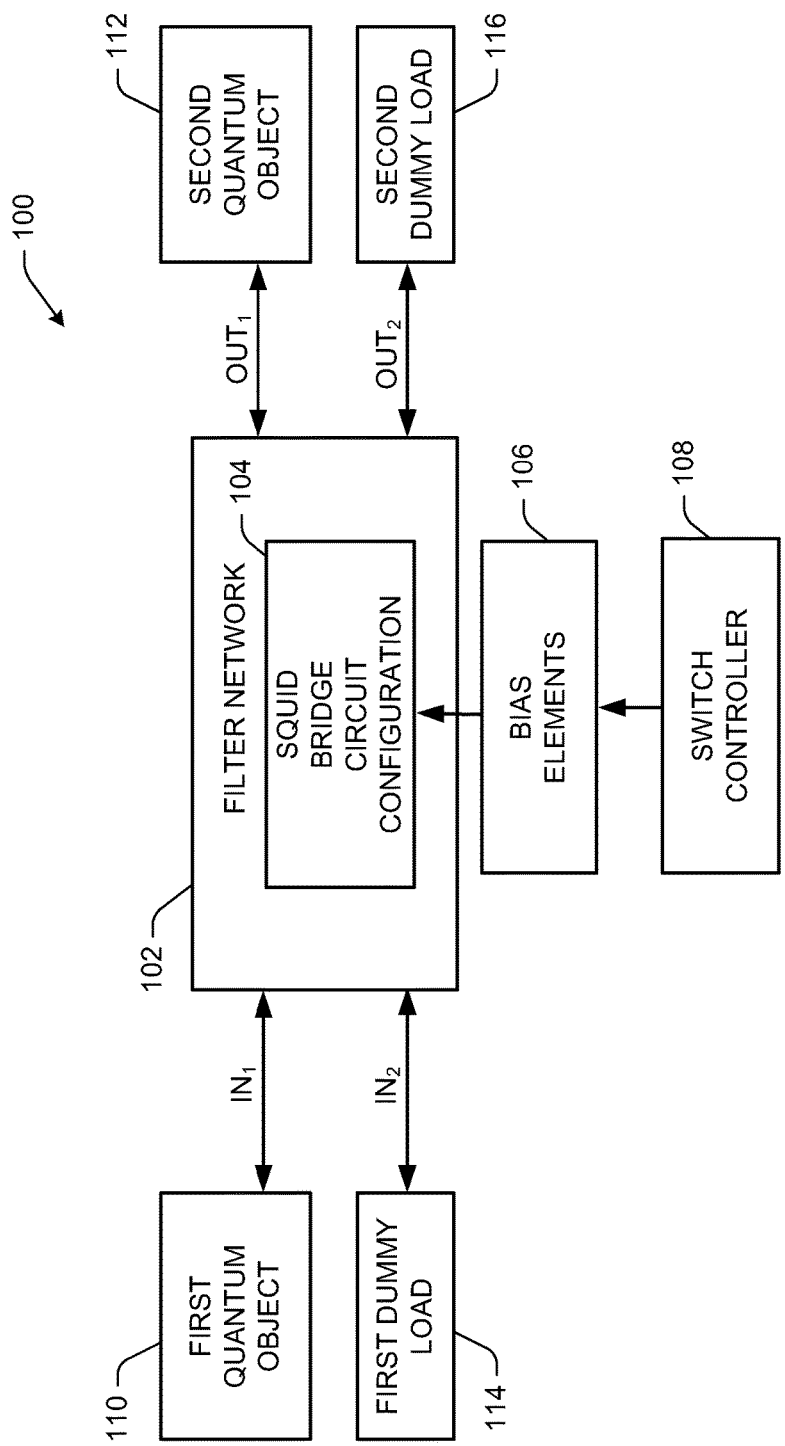
FIG. 1A is a block diagram of an example superconducting load-compensated tunable coupler.
Figure 1B:
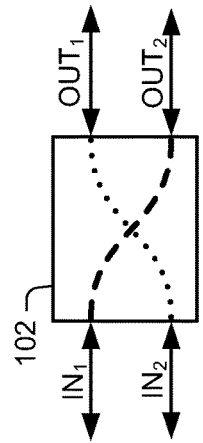
FIG. 1B illustrates the activated state of the example superconducting load-compensated tunable coupler of FIG. 1A.

FIG. 1A illustrates an example of a load-compensated tunable coupler system 100. When the coupler is activated, the load-compensated tunable coupler system 100 can use filter network 102 having SQUID bridge circuit configuration 104 to connect a first quantum object 110, sometimes referred to herein as a source quantum object, to a second quantum object 112, sometimes referred to herein as a target quantum object. First quantum object 110 can be connected to filter network 102 via a first port or terminal $IN_1$. Second quantum object 112 can be connected to filter network 102 via third port or terminal $OUT_1$. In this state filter network 102 can also connect a first dummy load 114 to a second dummy load 116 via second port or terminal $IN_2$ and fourth port or terminal $OUT_2$. This activated mode of tunable coupler system 100 constitutes a "bar" mode of filter network 102, as illustrated in FIG. 1B, routing a first signal from the first port $IN_1$ to the third port $OUT_1$ and a second signal from the second port $IN_2$ to the fourth port $OUT_2$.

Figure 1C:
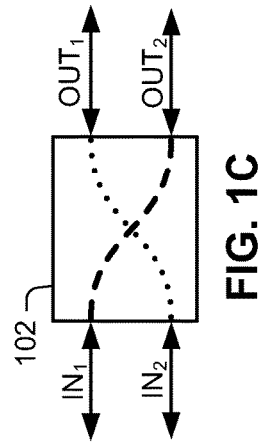
FIG. 1C illustrates the deactivated state of the example superconducting load-compensated tunable coupler of FIG. 1A.

When the coupler is deactivated, the load-compensated tunable coupler system 100 can use filter network 102 to connect the first quantum object 110 to the second dummy load 116 configured to approximate one or more characteristics of second quantum object 112. Similarly, in the deactivated state, filter network 102 can connect second quantum object 112 to first dummy load 114 configured to approximate one or more characteristics of first quantum object 110. This deactivated mode of tunable coupler system 100 constitutes a "cross" mode of filter network 102, as illustrated in FIG. 1C, routing a first signal from the first port $IN_1$ to the fourth port $OUT_2$ and a second signal from the second port $IN_2$ to the third port $OUT_1$.

Dummy loads 114, 116 are, for example, inductances sized to maintain the characteristic energy of the quantum object to which each dummy load respectively connects in the uncoupled state. Resultantly, irrespective of the connectivity, the load on each quantum object does not change, from the perspective of the quantum object. The dummy loads can also be referred to as simulated loads or ballasts.

The above-described configuration illustrated in FIG. 1A represents but one example of system 100. In another example, the positions (i.e., connections to filter network 102) of the second quantum object 112 and the second dummy load 116 can be interchanged such that the activated or coupled state is the cross state (as shown in FIG. 1C) and the deactivated or uncoupled state is the bar state (as shown in FIG. 1B). Similarly, the positions of the first quantum object 110 and the first dummy load 114 can be interchanged. Whatever the configuration, the larger control system and switch controller 108 can be adapted accordingly.

Filter network 102 can thus constitute a superconducting cross-bar switch that can provide a band-pass filtered output signal that can corresponds to a desirable portion (e.g., particular frequency bandwidth) of a signal passing from each respective input port through the desired sections to a respective selected output port. Additionally, the undesired portion of the signals can be blocked, such that none of the undesired portion of the signals passes through the filter network to any of the output ports.

The load-compensated tunable coupler system 100 can be implemented in any of a variety of superconducting circuit systems to provide coupling and decoupling between quantum objects (e.g., qubits or resonators). The signals between the coupled objects can be, for example, microwave signals that are implemented in a control scheme for a quantum circuit, such as performing a gate or a readout operation on a qubit. As another example, the signals can be a signal pulse, a communication signal, or a control command signal. The load-compensated tunable coupler system 100 can operate at cryogenic temperatures, can dissipate substantially no power, and can be controlled with single flux quantum (SFQ) compatible signals.

Load-compensated tunable coupler system 100 can include a superconducting cross-bar switch formed from a microwave band-pass filter network that can include one or more impedance components (e.g., capacitors, inductors) for configuring a first input portion of the filter network 102 as one or more first input resonators or poles, a second input portion of the filter network 102 as one or more second input resonators or poles, a first output portion of the filter network as one or more first output resonators or poles, and a second output portion of the filter network as one or more second output resonators or poles. The load-compensated tunable coupler system 100 can include a switch controller 108 and bias elements 106. The filter network 102 can employ variable inductance coupling elements controlled by magnetic flux via the bias elements 106 and the switch controller 108 to couple and decouple each input first and second input resonator to a respective one of each first and second output resonator based on a selected mode of either the bar state (which can correspond to an activated state or coupled state when configured as shown in FIG. 1A) or cross state (corresponding to a deactivated state or uncoupled state when configured as shown in FIG. 1A).

The aforementioned variable inductance coupling elements can be Josephson junctions. The inductance of the Josephson junctions can be switched between, on the one hand, a low inductance state for coupling different filter sections (e.g., resonators or poles) to one another and to pass signals through these coupled sections, and, on the other hand, a high inductance state to decouple different filter sections from one another to block signals from passing through the decoupled sections. The Josephson junctions can be arranged and controlled between low and high inductance states to switch the superconducting cross-bar switch between a bar state and a cross state to control the route of the signals passing through the cross-bar switch. The Josephson junctions can be arranged as elements of RF SQUIDs or SQUIDs in a SQUID bridge circuit configuration 104.

The SQUID bridge circuit configuration 104 can include a first SQUID that can include a first inductor and a third inductor coupled to opposite sides of a first Josephson junction, where the first inductor forms at least a portion of a first pole or resonator of the filter circuit, and the third inductor forms at least a portion of a third pole or resonator of the filter circuit. A second SQUID can be formed by a second inductor and the third inductor coupled to opposite sides of a second Josephson junction, a third SQUID can be formed by the first inductor and a fourth inductor coupled to opposite sides of a third Josephson junction, and a fourth SQUID can be formed by the second inductor and the fourth inductor coupled to opposite sides of a fourth Josephson junction. The second inductor forms at least a portion of a second pole or resonator of the filter circuit, and the fourth inductor forms at least a portion of a fourth pole or resonator of the filter circuit.

The Josephson junctions can have a first inductance when no current or a low current is induced in its respective SQUID, and a second inductance when a current or a higher current is induced in its respective SQUID that is at a predetermined threshold that generates or induces a flux, for example, greater than about 0.1 $\Phi 0$ and less than about 0.45 $\Phi 0$, where $\Phi 0$ is equal to a flux quantum. The first inductance (e.g., $h/2e*1/I_C$, where h is Planck's constant divided by $2\pi$, e is electron charge, and $I_C$ is the critical current of the Josephson junction) can provide coupling between desired sections of a filter network, such to allow passing of a desired bandwidth portion of an input signal between opposing ends of the the desired sections. The second inductance (e.g., a comparatively large inductance value) can provide decoupling between the sections of the filter network, such that the passing of the desired bandwidth portion of the input signal is blocked between opposing ends of the undesired sections.

In one example, the first pole of the filter network is coupled to a first input port, and the second pole of the filter network is coupled to a second input port. Furthermore, the third pole of the filter network is coupled to a first output port and the fourth pole of the filter network is coupled to a second output port. In a bar state, flux can be induced in the second SQUID and the fourth SQUID causing the second and fourth Josephson junctions to have a high inductance, while flux is not induced in the first SQUID and the third SQUID causing the first and third Josephson junctions to have a low inductance. This allows for a first signal to pass from the first input port through the first pole and third pole to the first output port and blocking the first signal from passing to the second output port through the fourth pole. Additionally, a second signal can pass from the the second input port through the second pole and fourth pole to the second output port and blocking the second signal from passing to the first output port through the third pole.

In a cross state, flux can be induced in the first SQUID and the third SQUID causing the first and third Josephson junctions to have a high inductance, while flux is not induced in the second SQUID and the fourth SQUID causing the second and fourth Josephson junctions to have a low inductance. This allows for a first signal to pass from the first input port through the first pole and fourth pole to the second output port and blocking the first signal from passing to the first output port through the third pole. Additionally, a second signal can pass from the the second input port through the second pole and third pole to the first output port and blocking the second signal from passing to the second output port through the fourth pole.

Figure 2:
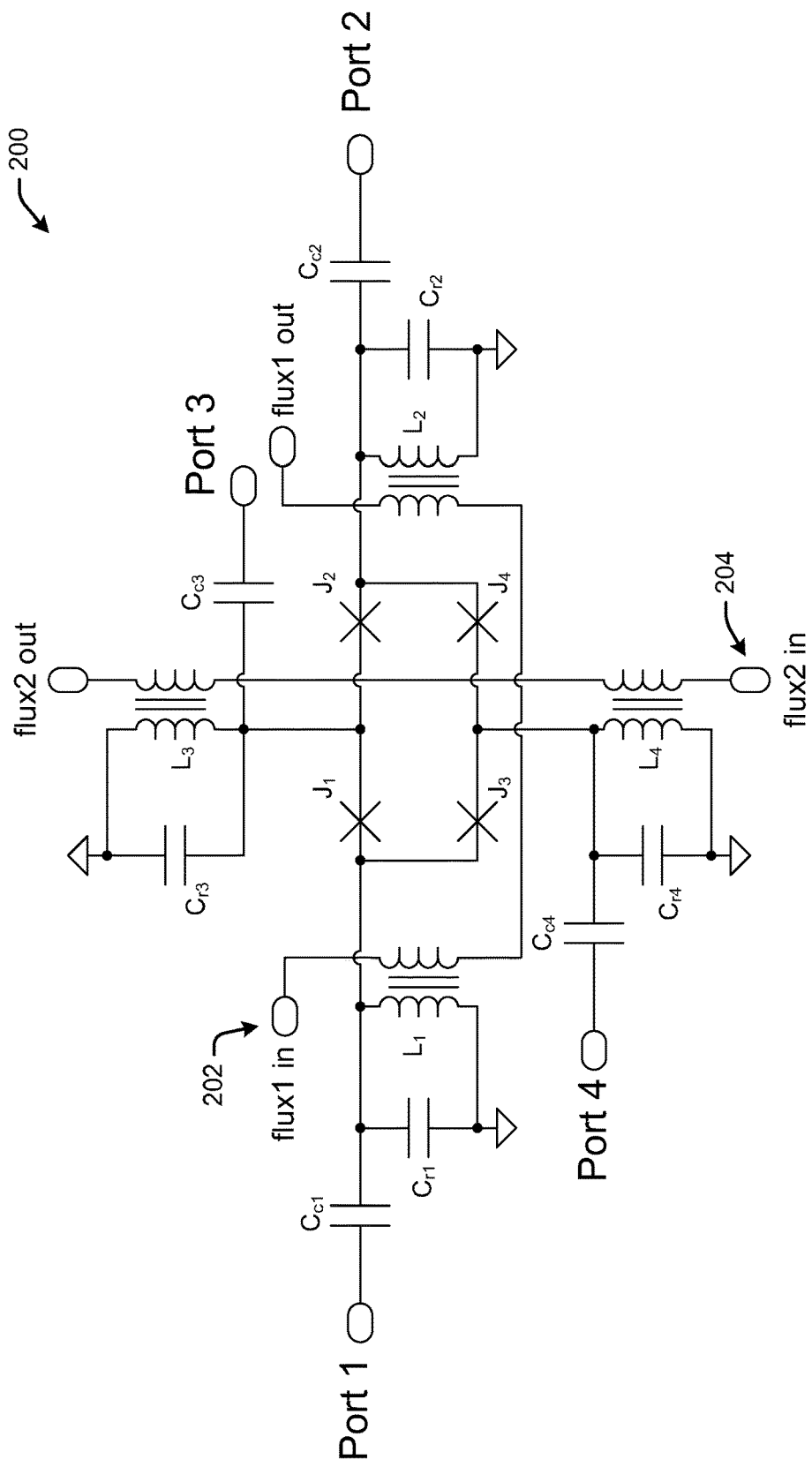
FIG. 2 illustrates a schematic diagram of a cross-bar switch circuit and associated bias elements.

FIG. 2 illustrates a schematic diagram of a cross-bar switch circuit 200 and associated bias elements. The cross-bar switch circuit is formed of a band-pass filter having a first port, labeled Port 1, a second port, labeled Port 2, a third port, labeled Port 3, and a fourth port, labeled Port 4. Current is provided through a first control line 202 that is inductively coupled to a pole or resonator associated with Port 1 and that is inductively coupled to a pole or resonator associated with Port 2. Current is also provided through a second control line 204 that is coupled to a pole or resonator associated with Port 3 and that is inductively coupled to a pole or resonator associated with Port 4. In both a first configuration (e.g., bar state) and a second configuration (e.g., cross state), current flows through the first control line 202 in the direction from the flux1 in to flux1 out. In the first configuration, current flows through the second control line 204 in the direction of flux2 in to flux2 out, which results in a first signal at Port 1 to be routed to Port 3 (or vice-versa), and a second signal at Port 2 to be routed to Port 4 (or vice-versa), whereas all other pair-wise combinations of ports are mutually isolated. In the second configuration, current flows through the second control line 204 in the direction of flux2 out to flux2 in, which results in a first signal at Port 1 to be routed to Port 4 (or vice-versa), and a second signal at Port 2 to be routed to Port 3 (or vice-versa), whereas all other pair-wise combinations of ports are mutually isolated.

Referring to FIG. 2, consider signal propagation from Port 1 to Port 4 for the second configuration. The signal from Port 1 enters the circuit via series coupling capacitor $C_{c1}$ which provides an input coupling capacitance to a band-pass filter. The signal then passes through shunt resonator comprising a parallel combination of $C_{r1}$ and $L_1$, forming the filter's first pole. Next the signal is coupled via Josephson junction $J_3$ to the filter's fourth pole, formed by the parallel combination of $C_{r4}$ and $L_4$, and finally exits the filter through the output coupling capacitor $C_{c4}$ into Port 4. Signals entering from Port 2 are similarly directed to Port 3 by traversing the band-pass filter formed by poles $C_{r2}\|L_2$ and $C_{r3}\|L_3$ and coupling elements $C_{c2}$, $J_2$, and $C_{c3}$. The control fluxes are arranged such that in this setting no signal can propagate through junctions $J_1$ and $J_4$ due to the high inductance state of these junctions as determined by the control fluxes.

In the first configuration of the control fluxes, $J_2$ and $J_3$ are in a high inductance state, whereas $J_1$ and $J_4$ are in a low inductance state. In this first configuration a signal from Port 1 will be routed to Port 3 via the band-pass filter formed by poles $C_{r1}\|L_1$ and $C_{r3}\|L_3$ and coupling elements $C_{c1}$, $J_1$, and $C_{c3}$, while signals from Port 2 are routed to Port 4 via the band-pass filter formed by poles $C_{r2}\|L_2$ and $C_{r4}\|L_4$ and coupling elements $C_{c2}$, $J_4$, and $C_{c4}$.

Each of the four Josephson junctions $J_1$-$J_4$ is connected between two nodes of the circuit, which are also connected to grounded inductors. For example, $J_1$ is connected to grounded inductors $L_1$ and $L_3$. Thus each of the junctions is embedded in a superconducting inductive loop forming an RF SQUID. When the RF SQUID loop encloses zero applied magnetic flux, the associated junction is in a low inductance state and allows transmission of microwave signals. When the RF SQUID loop encloses an externally applied flux that is a substantial fraction of $\Phi_0/2$, the associated junction is in a high inductance state and does not allow transmission of microwave signals. Therefore, the path that is traversed by microwave signal through the circuit is controlled by the fluxes applied to each of the RF SQUID loops.

For example, a flux $\Phi_{ON}$, which is substantially zero, corresponds to a low inductance state of the junction, and a flux $\pm\Phi_{OFF}$, which is a significant fraction of $\pm\Phi_0/2$, corresponds to a high inductance state of the junction. For example, a current can be supplied on control line 202 from port flux1 in to port flux1 out, such that the flux coupled to inductor $L_1$ via the transformer in FIG. 2 is $\Phi_{OFF}+\Phi_{ON})/2$ and the flux coupled to inductor $L_2$ via its transformer is $-(\Phi_{OFF}+\Phi_{ON})/2$ (the negative sign being due to the transformer's opposite winding). Furthermore, a current can be supplied on control line 204 from port flux 2 in to flux 2 out, such that the flux coupled to inductor $L_4$ via the transformer is $(\Phi OFF-\Phi_{ON})/2$ and the flux coupled to inductor $L_3$ is $-(\Phi_{OFF}-\Phi_{ON})/2$ (the negative sign being due to the transformer's opposite winding).

In this situation, the flux enclosed by the $L_1$-$J_3$-$L_4$ RF SQUID is $(\Phi_{OFF}+\Phi_{ON})/2+\Phi_{OFF}-\Phi_{ON})/2=\Phi_{OFF}$ and $J_3$ is in a high inductance state. Similarly the flux enclosed by the $L_2$-$J_2$-$L_3$ RF SQUID is $(\Phi_{OFF}+\Phi_{ON})/2-(\Phi_{OFF}-\Phi_{ON})/2=-\Phi_{OFF}$ and junction $J_2$ is also in a high inductance state. The same configuration gives $\pm\Phi_{ON}$ in the $L_1$-$J_1$-$L_3$ and $L_4$-$J_4$-$L_2$ loops so that $J_1$ and $J_4$ are in the low inductance state. For this configuration of control currents, Port 1 is connected to Port 3, and Port 2 is connected to Port 4. If the sign of the current supplied on the flux 2 line 34 is reversed, so that now current flows from flux 2 out to flux 2 in, then junctions $J_1$ and $J_4$ are in a high inductance state while junctions $J_2$ and $J_3$ are in a low inductance state, so that Port 1 is now connected to Port 4, and Port 2 is now connected to Port 3.

Several versions of the cross-bar switch circuit 200 can be designed, each having different transfer characteristics. For example, a switch built with a 4th order Chebychev filter design would provide different S-parameter characteristics. Therefore, the cross-bar switch described herein can be implemented in a variety of different filter configuration to fit requirements on, for example, bandwidth, ripple, number or sections, return loss, etc. Control signals can be constrained to the stop-band of the filter in order to minimize the leakage current from the control signal band into the RF signal band. Leakage can be further reduced by applying the control signals through low-pass filters whose band does not overlap that of the RF passband. The intensity of the RF signals that can be routed through the cross-bar switch is limited by the junction critical current. In some examples, the maximum RF power that can be passed through the switch is around −90 dBm. The cross-bar switch circuit can be designed to increase the maximum power by replacing each of the junctions $J_1$-$J_4$ with a series array of N junctions, each having a critical current N times larger than the original junction. For example, N=10 (10 junctions, each having×10 higher critical current) will increase the maximum power by 20 dB.

The cross-bar switch 200 of FIG. 2 provides a coherent routing mechanism capable of reconfiguring a quantum circuit on the fly. By adjusting the control currents flux1 and flux2 through lines 202 and 204, respectively, the connectivity between ports can be changed. With one set of controls, Port 1 connects to Port 3 and Port 2 connects to Port 4; with another set, Port 1 connects to Port 4 and Port 2 connects to Port 3.

The cross-bar functionality of switch 200 can be used to create an effective single-pole, single-throw (SPST) switch between two quantum objects that maintains the load on each object irrespective of the switch position, by, for example, connecting source and target quantum objects to Port 1 and Port 3, respectively, and simulated loads with inductances equal to those of the source and target objects to Port 2 and Port 4, respectively. In such a configuration, when the cross-bar switch is in one position, the source and target quantum objects are connected to each other; when the switch is in the other position, each object is connected to a simulated load, thereby maintaining the characteristic energy of each quantum object irrespective of the connectivity. Such a switch thus permits the selective exchange information between quantum objects by turning on or off the coupling between them, while also avoiding the presentation of a variable load on both objects and the problematic consequent change of their operating frequencies that can occur when the quantum objects are coupled using, for example, a simple tunable inductive element between the objects.

Figure 3:
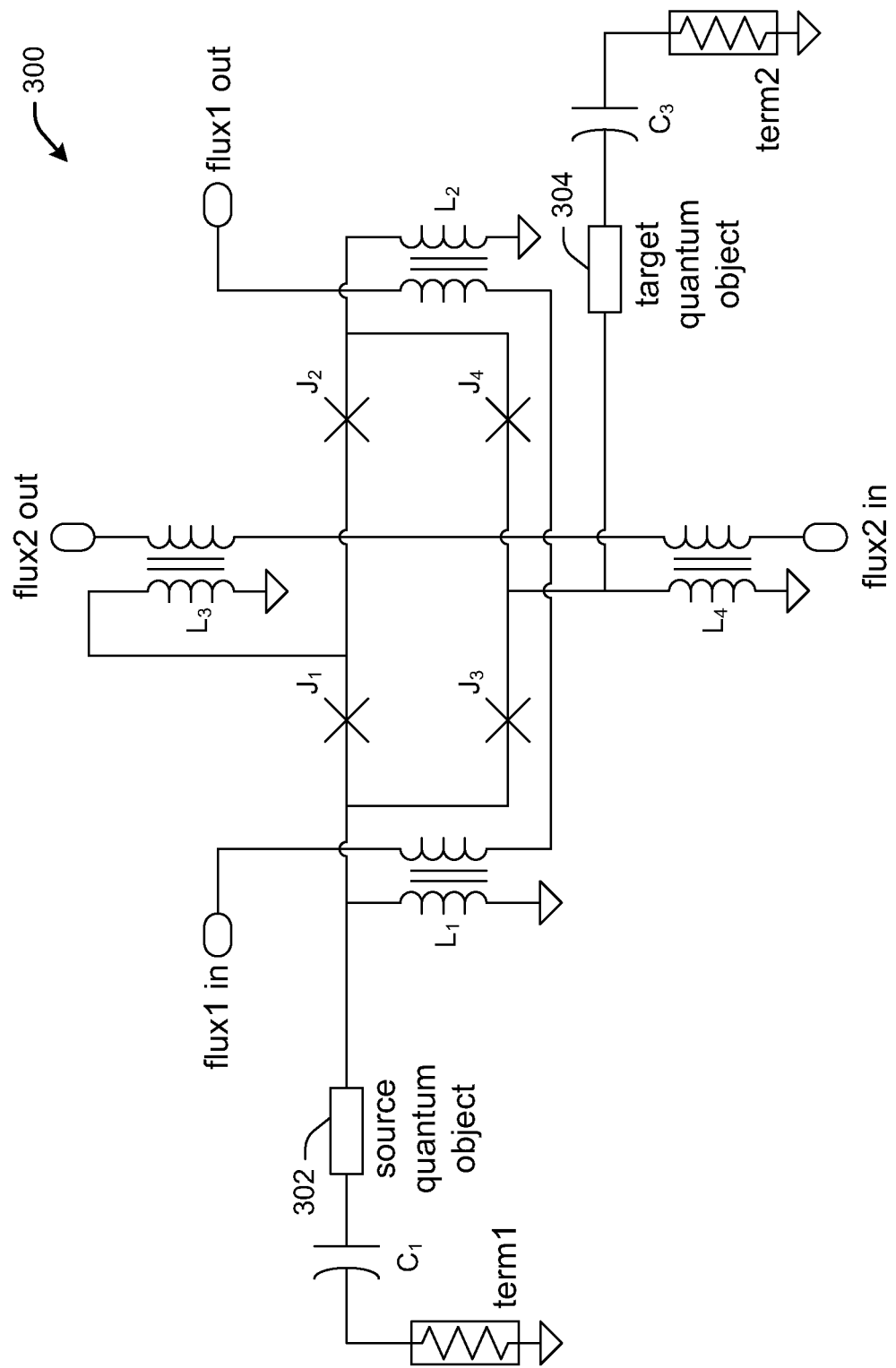
FIG. 3 illustrates a schematic diagram of a load-compensated tunable coupler.

FIG. 3 illustrates a schematic circuit diagram of an example load-compensated tunable coupler circuit 300 including a superconducting cross-bar switch. The illustrated design can be utilized in a simulation employing, for example, Agilent's Advanced Design Simulation (ADS) tool. The Josephson junction bridge consisting of Josephson junctions $J_1$-$J_4$ can correspond to the similar bridge in circuit 200 of FIG. 2. Like circuit 200, circuit 300 has two flux bias control lines, flux1 and flux2, labeled in the schematic by their nominal input and output ports, flux1 in, flux1 out, flux2 in, flux2 out. In some examples, one control line (e.g., flux1) can be configured to provide a DC control current to provide flux bias while the other control line (e.g., flux2) can be configured to provide a high-speed control current and thus provide the functionality of a switch toggle, i.e., to switch between bar and cross states. In other examples, flux2 can provide the DC control current and flux1 can be configured as the high-speed switch toggle. In either case, one pair of control ports can be connected to a DC or low-bandwidth transmission line and be designated as the slow control, while the other pair of control ports can be connected to a broadband transmission line and be designated as the fast (switch toggle) control. In the cross state, when Josephson junctions $J_1$ and $J_4$ are on, each quantum object 302, 304 is connected to a ballast (dummy load) $L_2$, $L_3$. For example, $L_2$ can correspond to first dummy load 114 in FIG. 1A, and $L_3$ can correspond to second dummy load 116 in FIG. 1A. In the bar state, when Josephson junctions $J_2$ and $J_3$ are on, the quantum objects 302, 304 are connected to each other.

The ballasts $L_2$, $L_3$ can be sized such that the inductive load on the quantum objects is equal in cross and bar states. That is, the inductance values of $L_2$ and $L_3$ can be chosen based on the characteristics of the target and source quantum objects 304, 302, respectively, and their respective shunt inductors $L_4$, $L_1$. $L_2$ and $L_3$ can thus be designed to provide a good match to their respective quantum object loads, i.e., from the perspective of the coupler, $L_3$ can be made to look as much as possible like the $L_4$/target object 304 system, and $L_2$ can be made to look as much as possible like the $L_1$/source quantum object system. In some examples, $L_2$ and $L_3$ can be roughly equal in inductance value, and all four Josephson junctions can be roughly equal in size. All four Josephson junctions $J_1$-$J_4$ can have some parametric variation to match all the inductances and their selected values. The values of $L_1$ and $L_4$ can be selected based on the desired coupling strength. $L_1$ and $L_4$ can also be roughly equal in inductance value, but there may be use cases where these components may be unequal.

In an example simulation methodology, each quantum object 302, 304 can be represented as some resonant object, e.g., a transmission line of particular length and impedance. Josephson junctions $J_1$-$J_4$ can be represented in the simulation by inductors of variable inductance, corresponding reasonably well with the actual physical behavior of Josephson junctions, i.e., having some tunable inductance in a circuit. The junction nominal inductances in their low inductance state can all be, for example, 882 pH, and the high inductance state can have, for example, 50 times greater inductance than the low-inductance value. The component values can be made such that the input and output capacitances ($C_1$, $C_2$) are each 5 fF, shunt inductors $L_1$ and $L_4$ are each 20 pH, and dummy load inductors $L_2$ and $L_3$ are each 20 pH. Component values can be selected such that the signal path approximates a 2nd-order Butterworth band pass filter response.

As discussed above, in the illustrated configuration 300, the current through line flux1 can be held constant while the current through line flux2 can be varied to provide a single coupler control signal. In an alternate configuration, the roles of the two control lines flux1, flux2 can be swapped with a corresponding change to the current setpoints. The load-compensated tunable coupler 300 of FIG. 3 thus utilizes a symmetric arrangement of junctions and removes the need for two dynamic control signals, simplifying the device's operation as compared to circuit 200. Coupler 300 also prevents the loading on the coupled objects from changing when the coupler is operated, and thus avoids an unwanted shift in the resonant frequencies of the coupled objects.

Figure 4:
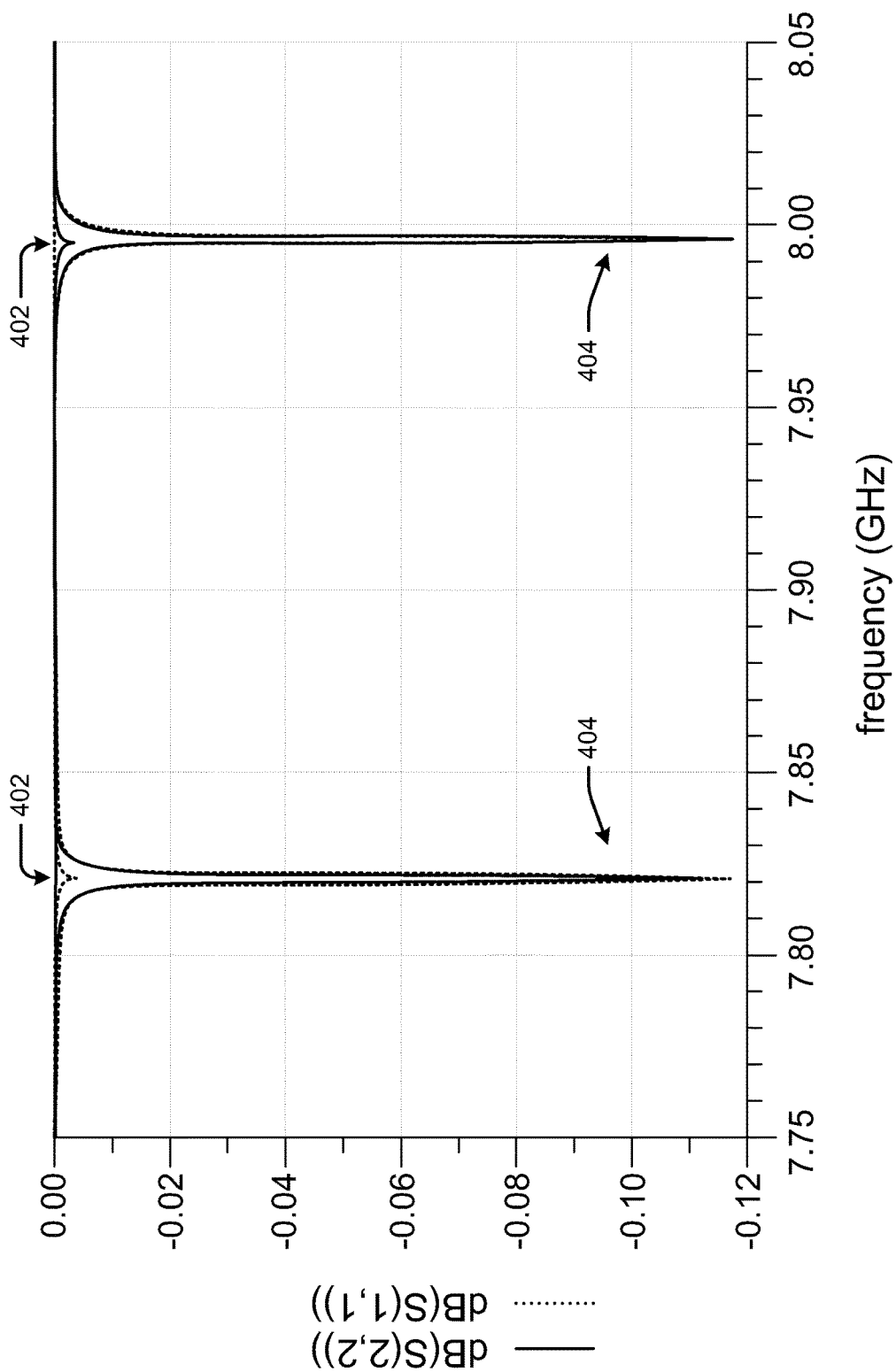
FIG. 4 is a graph of an S-parameter simulation of the circuit of FIG. 3.

FIG. 4 is a set of superimposed graphs of S-parameter simulations of the circuit of FIG. 3 in both coupled mode 404 and uncoupled mode 402. S-parameter plots in effect show how much energy flows through a part of a circuit. The simulation output for one quantum object (e.g., target quantum object 302) is indicated as solid-line plots and the simulation output for another quantum object (e.g., source quantum object 304) is graphed as broken-line plots. As indicated at positions of arrows 402, the simulation results demonstrate no energy shift in individual objects when the coupler is turned off (i.e., when the objects are uncoupled). With the coupling off, the plots show only very small downward bumps in the S-parameters, indicated at the top of the graph at the positions of arrows 402, showing essentially no power flowing. With the coupling on, the plots show very large decreases in the S-parameters, showing that there is significant power flowing (i.e., that the two quantum objects are coupled). The large depressions show that the quantum objects are exchanging information during coupling. Because the small depressions at the top of the graph are at the same position along the frequency axis of the graph as the corresponding large depressions, the plots indicate that the operating frequency of each quantum object has remained constant between on and off states of the coupling.

The load-compensated tunable coupler described herein thus can use a superconducting cross-bar switch to switch between coupling two quantum objects together and coupling them each to dummy loads so that irrespective of whether the cross-bar switch is open or closed, each quantum object always sees the same load, thereby mitigating the concern about changing the operating frequencies of the different quantum objects.

Figure 5:
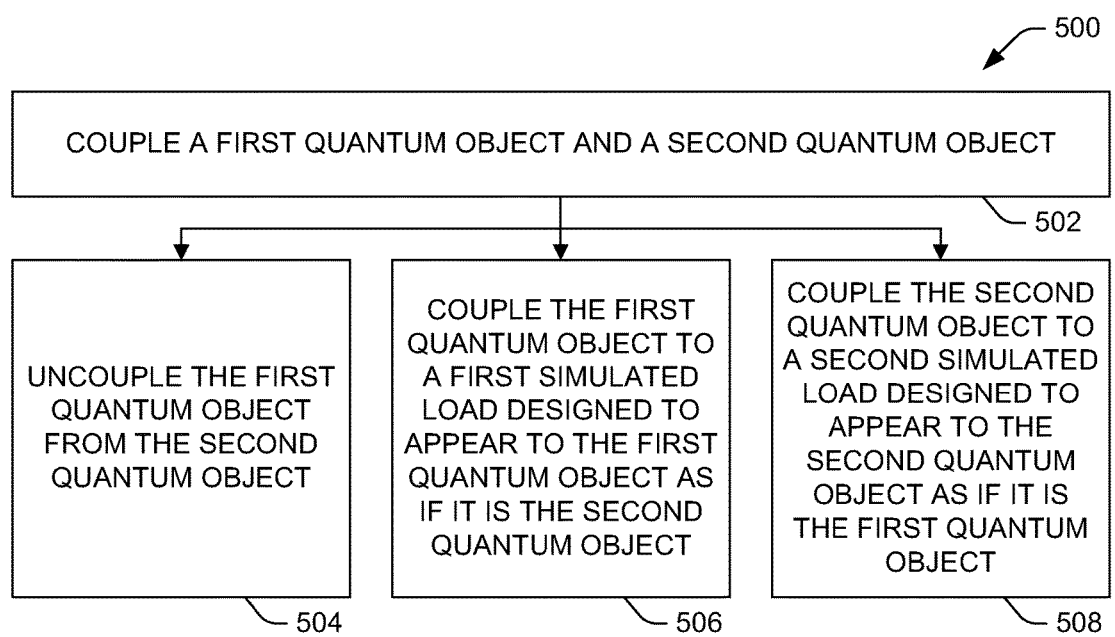
FIG. 5 is a flow chart illustrating an example method of coupling and load-compensated uncoupling two quantum objects.

The flow chart of FIG. 5 illustrates a method 500 of coupling and load-compensated uncoupling two quantum objects. A first quantum object and a second quantum object are coupled 502. This coupling can be done, for example, via a superconducting cross-bar switch arranged as illustrated in FIG. 3. At the same time as uncoupling 504 the two quantum objects, the first quantum object can be coupled 506 to a first simulated load designed to appear to the first quantum object as though it were the second quantum object, and the second quantum object can be coupled 508 to a second simulated load designed to appear to the second quantum object as though it were the first quantum object. In this way, the two quantum objects can be selectively coupled or decoupled without changing their resonant frequencies.

The simulated loads can be so designed, e.g., by selecting or setting their inductance values. For example, the first simulated load can be an inductor sized to present the same inductive load to the first quantum object as the first quantum object would experience from being coupled to the second quantum object. Similarly, the second simulated load can be an inductor sized to present the same inductive load to the second quantum object as the second quantum object would experience from being coupled to the first quantum object.

The quantum objects and the simulated loads in the method 500 can be respectively coupled or uncoupled, for example, using a superconducting cross-bar switch, like the cross-bar switch 200 shown in FIG. 2 or as configured in FIG. 3. For example, the quantum objects can be coupled through a first variable inductance coupling element, the first quantum object can be coupled to the first simulated load through a second variable inductance coupling element, and the second quantum object can be coupled to the second simulated load through a third variable inductance coupling element. The variable inductance coupling elements can be, for example, Josephson junctions. The variable inductance coupling elements can be switched between opposing inductance states to allow selective coupling between the quantum objects and the respective simulated loads by controlling an amount and polarity of current through a flux bias control line inductively coupled to the first and second simulated loads. Such control can be performed, for example, using a switch controller like switch controller 108 shown in FIG. 1.

For example, the first and a fourth variable inductance coupling element can be set to a low inductance, and the second and third variable inductance coupling elements can be set to a high inductance in a bar state to couple the quantum objects, and the first and fourth variable inductance coupling elements can be set to a high inductance, and the second and third variable inductance coupling elements to a low inductance in a cross state to couple each quantum object to its respective simulated load (i.e., the first quantum object to the first simulated load and the second quantum object to the second simulated load, using the nomenclature established with respect to FIG. 5).

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting load-compensated tunable coupler system comprising:
    a first quantum object connected to a first port of a superconducting cross-bar switch;
    a first dummy load approximating a load characteristic of the first quantum object connected to a second port of the switch;
    a second quantum object connected to a third port of the switch; and
    a second dummy load approximating a load characteristic of the second quantum object connected to a fourth port of the switch,
    such that the first and second quantum objects are coupled in one of a bar or a cross state of the switch, and in the other of the cross or the bar state of the switch, first and second quantum objects are uncoupled, the first quantum object is coupled to the second dummy load, and the second quantum object is coupled to the first dummy load.

2. The system of claim 1, wherein:
    the first port is coupled to the third port through a first variable inductance coupling element;
    the first port is coupled to the fourth port through a third variable inductance coupling element;
    the second port is coupled to the third port through a second variable inductance coupling element; and
    the second port is coupled to the fourth port through a fourth variable inductance coupling element.

3. The system of claim 2, further comprising a switch controller configured to control the setting of the cross-bar switch between the bar state and the cross state by changing the variable inductance coupling elements between opposing inductance states to allow selective routing of signals between the first port to the third port and the second port to the fourth port in the bar state, and the first port to the fourth port and the second port to the third port in the cross state.

4. The system of claim 3, wherein the switch controller controls an amount and polarity of current through a flux bias control line inductively coupled to the first and second dummy loads to alternate the system between the bar state and the cross state.

5. The system of claim 3, wherein the switch controller sets the first and fourth variable inductance coupling elements to a low inductance, and the second and third variable inductance coupling elements to a high inductance in a bar state, and sets the first and fourth variable inductance coupling elements to a high inductance, and the second and third variable inductance coupling elements to a low inductance in a cross state.

6. The system of claim 2, wherein the first variable inductance element is a first Josephson junction, the second variable inductance element is a second Josephson junction, the third variable inductance element is a third Josephson junction and the fourth variable inductance coupling element is a fourth Josephson junction.

7. The system of claim 1, wherein the first and second dummy loads are each an inductor.

8. The system of claim 1, wherein the load characteristic of the first and second quantum objects respectively approximated by the first and second dummy loads is an inductive load characteristic.

9. The system of claim 1, wherein the operating frequency of each quantum object remains constant between coupled and uncoupled states.

10. A method of coupling and load-compensated uncoupling two quantum objects, the method comprising:
    coupling a first quantum object and a second quantum object through a superconducting cross-bar switch; and
    at the same time as uncoupling the two quantum objects,
    coupling the first quantum object to a first simulated load designed to appear to the first quantum object as if it is the second quantum object in load, and
    coupling the second quantum object to a second simulated load designed to appear to the second quantum object as if it is the first quantum object in load.

11. The method of claim 10, wherein the first simulated load is an inductor sized to present the same inductive load to the first quantum object as the first quantum object would experience from being coupled to the second quantum object, and the second simulated load is an inductor sized to present the same inductive load to the second quantum object as the second quantum object would experience from being coupled to the first quantum object.

12. The method of claim 10, wherein the quantum objects and the simulated loads are respectively coupled or uncoupled using a superconducting cross-bar switch.

13. The method of claim 12, wherein:
    the quantum objects are coupled through a first variable inductance coupling element;
    the first quantum object is coupled to the first simulated load through a second variable inductance coupling element; and
    the second quantum object is coupled to the second simulated load through a third variable inductance coupling element.

14. The method of claim 13, wherein the variable inductance coupling elements are switched between opposing inductance states to allow selective coupling between the quantum objects and the respective simulated loads by controlling an amount and polarity of current through a flux bias control line inductively coupled to the first and second simulated loads.

15. The method of claim 14, wherein the first and a fourth variable inductance coupling element are set to a low inductance, and the second and third variable inductance coupling elements are set to a high inductance in a bar state to couple the quantum objects, and wherein the first and fourth variable inductance coupling elements are set to a high inductance, and the second and third variable inductance coupling elements to a low inductance in a cross state to couple each quantum object to its respective simulated load.

16. The method of claim 10, wherein the operating frequency of each quantum object remains constant between coupled and uncoupled states.

17. A superconducting load-compensated tunable coupler system comprising:
    first and second quantum objects each having a respective operating frequency;
    a Josephson junction bridge configured as a superconducting cross-bar switch, the bridge comprising:
        a first Josephson junction connected between the first quantum object and a first end of a second ballast that approximates an inductive load characteristic of the second quantum object;
        a second Josephson junction connected between the first end of the second ballast and a first end of a first ballast that approximates an inductive load characteristic of the first quantum object;
a third Josephson junction connected between the first quantum object and the second quantum object; and
a fourth Josephson junction connected between the second quantum object and the first end of the first ballast; and
one or more flux bias lines arranged to switch the inductance of the Josephson junctions between:
the first and fourth Josephson junctions having a high inductance state and the second and third Josephson junctions having a low inductance state, wherein the first and second quantum objects are coupled to each other; and
the first and fourth Josephson junctions having a low inductance state and the second and third Josephson junctions having a high inductance state, wherein the first quantum object is coupled to the second ballast and the second quantum object is coupled to the first ballast.

18. The system of claim 17, wherein the respective operating frequency of each quantum object remains constant between a coupled state in which the first and second quantum objects are coupled to each other and a decoupled state in which the first and second quantum objects are respectively coupled to the second and first ballasts.

19. The system of claim 18, further comprising a switch controller configured to control an amount and polarity of current through one or more flux bias lines to adjust the inductance states of the Josephson junctions and thereby switch between the coupled and decoupled states.

20. The system of claim 17, wherein each of the first and second quantum objects is either a qubit or a resonator.

* * * * *